US012601787B2

(12) United States Patent
Ebenezer et al.

(10) Patent No.: US 12,601,787 B2
(45) Date of Patent: Apr. 14, 2026

(54) ESTIMATION OF BATTERY EQUIVALENT CIRCUIT MODEL PARAMETERS BY DECOMPOSITION OF SENSE CURRENT AND TERMINAL VOLTAGE INTO SUBBANDS

(71) Applicant: Cirrus Logic International Semiconductor Ltd., Edinburgh (GB)

(72) Inventors: Samuel P. Ebenezer, Gilbert, AZ (US); Emmanuel A. Marchais, Dripping Springs, TX (US); Eric J. King, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 405 days.

(21) Appl. No.: 18/308,449

(22) Filed: Apr. 27, 2023

(65) Prior Publication Data

US 2024/0133957 A1 Apr. 25, 2024

Related U.S. Application Data

(60) Provisional application No. 63/428,662, filed on Nov. 29, 2022, provisional application No. 63/415,413, filed on Oct. 12, 2022.

(51) Int. Cl.
*G01R 31/367* (2019.01)
*G01R 31/3842* (2019.01)
*G01R 31/389* (2019.01)

(52) U.S. Cl.
CPC ....... *G01R 31/367* (2019.01); *G01R 31/3842* (2019.01); *G01R 31/389* (2019.01)

(58) Field of Classification Search
None
See application file for complete search history.

(56) References Cited

U.S. PATENT DOCUMENTS 8,415,926 B2 4/2013 Bhardwaj et al.
9,157,968 B1 10/2015 Taylor et al.
(Continued)

FOREIGN PATENT DOCUMENTS

CN 106126783 A 11/2016
CN 114609525 A 6/2022
(Continued)

OTHER PUBLICATIONS

International Search Report and Written Opinion of the International Searching Authority, International Application No. PCT/US2021/052009, mailed Dec. 20, 2021.
(Continued)

*Primary Examiner* — Huy Q Phan
*Assistant Examiner* — Carl F.R. Tchatchouang
(74) *Attorney, Agent, or Firm* — Jackson Walker L.L.P.

(57) ABSTRACT

A method for estimating equivalent circuit model parameters of a battery may include measuring a battery voltage across terminals of the battery and a battery current drawn from the battery, decomposing the battery voltage and the battery current into a plurality of sub-bands, each sub-band of the plurality of sub-bands based on a time constant that characterizes a temporal behavior of the battery, for each sub-band of the plurality of sub-bands, estimating an equivalent resistance for such sub-band based on a spectral content of the battery voltage and battery current for such sub-band, and estimating an open circuit voltage of the battery based at least on the spectral content of the battery voltage and battery current present in one of the plurality of sub-bands and the equivalent resistances of the plurality of sub-bands.

24 Claims, 7 Drawing Sheets

(56) References Cited

U.S. PATENT DOCUMENTS

| | | | |
|---|---|---|---|
| 10,345,385 | B2 | 7/2019 | Wampler et al. |
| 11,016,126 | B2 | 5/2021 | Hurwitz |
| 11,125,707 | B1 | 9/2021 | Fasching et al. |
| 11,169,213 | B2 | 11/2021 | Karippumannil Prasad et al. |
| 2005/0021254 | A1 | 1/2005 | Merl et al. |
| 2005/0156559 | A1 | 7/2005 | Thibedeau et al. |
| 2007/0035307 | A1 | 2/2007 | Schoch |
| 2008/0054848 | A1 | 3/2008 | Yun et al. |
| 2011/0309838 | A1* | 12/2011 | Lin ..................... H01M 10/48 |
| | | | 324/427 |
| 2013/0110429 | A1 | 5/2013 | Mitsuyama et al. |
| 2014/0088897 | A1 | 3/2014 | Sharma et al. |
| 2014/0244225 | A1 | 8/2014 | Balasingam et al. |
| 2015/0258907 | A1 | 9/2015 | Lee |
| 2015/0301116 | A1 | 10/2015 | Baker |
| 2016/0001672 | A1* | 1/2016 | Lee ....................... H02J 7/855 |
| | | | 320/136 |
| 2016/0016482 | A1* | 1/2016 | Lee ....................... B60K 6/40 |
| | | | 701/22 |
| 2016/0039419 | A1 | 2/2016 | Wampler et al. |
| 2016/0077160 | A1 | 3/2016 | Wampler, II |
| 2019/0120910 | A1 | 4/2019 | Ghantous et al. |
| 2020/0182937 | A1 | 6/2020 | Wampler, II |
| 2020/0191876 | A1 | 6/2020 | Shin et al. |
| 2020/0379049 | A1* | 12/2020 | Gray ................... G01R 31/367 |
| 2021/0247451 | A1* | 8/2021 | Hong ................... G01R 31/367 |
| 2021/0359631 | A1 | 11/2021 | Ives et al. |
| 2021/0391741 | A1 | 12/2021 | Rigdon et al. |
| 2021/0405121 | A1 | 12/2021 | Gill et al. |
| 2022/0011373 | A1 | 1/2022 | Zappen et al. |
| 2022/0024438 | A1 | 1/2022 | Vuylsteke et al. |
| 2022/0074998 | A1 | 3/2022 | Aquilano et al. |
| 2022/0137143 | A1* | 5/2022 | Melanson ............. H02J 7/0047 |
| | | | 702/63 |
| 2022/0137146 | A1 | 5/2022 | Marchais et al. |
| 2024/0134325 | A1 | 4/2024 | Ebenezer et al. |
| 2024/0136930 | A1 | 4/2024 | Ebenezer et al. |
| 2025/0180651 | A1 | 6/2025 | Ebenezer |
| 2025/0180652 | A1 | 6/2025 | Ebenezer et al. |
| 2025/0180653 | A1 | 6/2025 | Kovvali et al. |
| 2025/0199077 | A1 | 6/2025 | Ebenezer et al. |

FOREIGN PATENT DOCUMENTS

| | | |
|---|---|---|
| EP | 2482423 A1 | 8/2021 |
| GB | 2598988 A | 3/2022 |
| JP | 2005221487 A | 8/2005 |
| WO | 2020097271 A1 | 5/2020 |
| WO | 2023212699 A1 | 11/2023 |
| WO | 2024081462 A1 | 4/2024 |

OTHER PUBLICATIONS

U.S. Appl. No. 63/606,389, filed Dec. 5, 2023.

International Search Report and Written Opinion of the International Searching Authority, International Application No. PCT/US2023/018171, mailed Jul. 31, 2023.

Waag, W. et al., "Experimental investigation of the lithium-ion battery impedance characteristic at various conditions and aging states and its influence on the application," Applied Energy, vol. 102, pp. 885-897, 2013.

Barzilai, J. et al., "Two-Point Step Size Gradient Methods," IMA Journal of Numerical Analysis, vol. 8, pp. 141-148, 1988.

Chen, L. et al., "State-of-Charge Estimation of Lithium-Ion Batteries Based on Fractional-Order Square-Root Unscented Kalman Filter," Fractal and Fractional, vol. 6, No. 2, p. 52, 2022.

Liu, C. et al., "State of power estimation of lithium-ion battery based on fractional-order equivalent circuit model," Journal of Energy Storage, vol. 41, 102954, 2021.

Tommasi, L. D. et al., "Single-Input-Single-Output Passive Macromodeling via Positive Fractions Vector Fitting," 12th IEEE Workshop on Signal Propagation on Interconnects, Avignon, France, May 2008.

Raydan, M. et al., "Relaxed steepest descent and Cauchy-Barzilai-Borwein method," Computational Optimization and Applications, vol. 21, No. 2, pp. 155-167, 2002.

Gustavsen, B. et al., "Rational approximation of frequency domain responses by vector fitting," IEEE Trans. on Power Delivery, vol. 14, No. 3, pp. 1052-1061, Jul. 1999.

Sato, K. et al., "Physics-based model of lithium-ion batteries running on a circuit simulator," IEEJ Transactions on Industry Applications, vol. 139, No. 5, pp. 523-534, 2019.

Ren, B. et al., "Parameter identification of a lithium-ion battery based on the improved recursive least square algorithm," IET Power Electronics, vol. 13, No. 12, pp. 2531-2537, Sep. 2020.

Hahn, M. et al., "Optimized Process Parameters for a Reproducible Distribution of Relaxation Times Analysis of Electrochemical Systems," Batteries, vol. 5, No. 2, 43, 2019.

Malenovsky, V. et al., "Optimal Step-Size LMS Algorithm Using Exponentially Averaged Gradient Vector," EUROCON 2005, pp. 1554-1557, Nov. 2005.

Zhang, C. et al., "Online estimation of battery equivalent circuit model parameters and state of charge using decoupled least squares technique," Energy, vol. 142, pp. 678-688, 2018.

Mclernon, D. C. et al., "On the convergence of the LMS algorithm with a rank-deficient input autocorrelation matrix," Signal Processing, vol. 89, pp. 2244-2250, 2009.

Tang, X. et al., "Li-ion Battery Parameter Estimation for State of Charge," Proceedings of the 2011 American Control Conference, San Francisco, California, Jun. 2011.

Gunasekar, S. et al., "Implicit Regularization in Matrix Factorization," 2018 Information Theory and Applications Workshop (ITA), Feb. 2018.

Buller, S. et al., "Impedance-Based Simulation Models of Supercapacitors and Li-Ion Batteries for Power Electronic Applications," IEEE Transactions on Industry Applications, vol. 41, No. 3, May-Jun. 2005.

Elwakil, A. S. , "Fractional-order circuits and systems: An emerging interdisciplinary research area," IEEE Circuits and Systems Magazine, vol. 10, No. 4, pp. 40-50, Nov. 2010.

Boukamp, B. A., "A Linear Kronig-Kramers Transform Test for Immittance Data Validation," J. Electrochem. Soc., vol. 142, No. 6, pp. 1885-1894, Jun. 1995.

Boukamp, B. A., "Distribution (function) of relaxation times, successor to complex nonlinear least squares analysis of electrochemical impedance spectroscopy?", J. Phys. Energy, vol. 2, 2020.

O'Leary, D. P., "Confidence Intervals for Inequality-Constrained Least Squares Problems, with Applications to III-Posed Problems," SIAM Journal on Scientific and Statistical Computing, vol. 7, No. 2, pp. 473-489, Apr. 1986.

Livesey, A. K. et al., "Analyzing the Distribution of Decay Constants in Pulse-Fluorimetry Using the Maximum Entropy Method," Biophysical Journal, vol. 52, No. 5, pp. 693-706, Nov. 1987.

Kong, X. et al., "An Exact Closed-Form Impedance Model for Porous-Electrode Lithium-Ion Cells," J. Electrochem. Soc., vol. 167, 2020.

Ye, J. et al., "An Adaptive Peak Power Prediction Method for Power Lithium-Ion Batteries Considering Temperature and Aging Effects," Processes, vol. 11, No. 8, p. 2449, 2023.

Shynk, J. J., "Adaptive IIR Filtering," IEEE ASSP Magazine, vol. 6, No. 2, pp. 4-21, Apr. 1998.

Sayed, A. H. et al., "A Survey of Spectral Factorization Methods," Numer. Linear Algebra Appl., vol. 8, pp. 467-496, 2001.

Rodriguez-Iturriaga, P. et al., "A physics-based fractional-order equivalent circuit model for time and frequency-domain applications in lithium-ion batteries," J. Energy Storage, vol. 64, 2023.

Agudelo, B. O. et al., "A Comparison of Time-Domain Implementation Methods for Fractional-Order Battery Impedance Models," Energies, vol. 14, No. 15, 4415, 2021.

Lopez-Villanueva, Juan A. et al., A Compact Model of the ZARC for Circuit Simulators in the Frequency and Time Domains, Int. J. Electron. Commun. 153 (2022).

U.S. Appl. No. 63/605,003, filed Dec. 1, 2023.

U.S. Appl. No. 63/605,031, filed Dec. 1, 2023.

U.S. Appl. No. 63/606,179, filed Dec. 5, 2023.

(56) References Cited

OTHER PUBLICATIONS

Examination Report under Section 18(3), United Kingdom Intellectual Property Office, Application No. GB2304568.5, dated Jan. 17, 2025.

International Search Report and Written Opinion, International Application No. PCT/US2024/054691, mailed Feb. 24, 2025.

International Search Report and Written Opinion of the International Searching Authority, International Application No. PCT/US2023/073001, mailed Dec. 1, 2023.

Combined Search and Examination Report under Sections 17 and 18(3), UKIPO, Application No. GB2416377.6, mailed May 2, 2025.

Combined Search and Examination Report under Sections 17 and 18(3), UKIPO, Application No. GB2416607.6, mailed May 16, 2025.

Zhang et al., A novel fractional variable-order equivalent circuit model and parameter identification of electric vehicle Li-ion batteries, ISA Transactions 97 (2020), 448-457.

* cited by examiner

ESTIMATION OF BATTERY EQUIVALENT CIRCUIT MODEL PARAMETERS BY DECOMPOSITION OF SENSE CURRENT AND TERMINAL VOLTAGE INTO SUBBANDS

RELATED APPLICATION

The present disclosure claims priority to U.S. Provisional Patent Application Ser. No. 63/415,413, filed Oct. 12, 2022, and to U.S. Provisional Patent Application Ser. No. 63/428, 662, filed Nov. 29, 2022, both of which are incorporated by reference herein in their entireties.

FIELD OF DISCLOSURE

The present disclosure relates in general to circuits for electronic devices, including without limitation personal portable devices such as wireless telephones and media players, and more specifically, to online characterization of battery model parameters with augmented dynamic stimulus and estimating equivalent circuit model parameters of a battery.

BACKGROUND

Portable electronic devices, including wireless telephones, such as mobile/cellular telephones, tablets, cordless telephones, mp3 players, and other consumer devices, are in widespread use. Such a portable electronic device may include a battery (e.g., a lithium-ion battery) for powering components of the portable electronic device.

In operation, the terminal voltage of a battery may droop under a load current due to internal output impedance of the battery. Such output impedance may be modeled in a number of suitable manners, including with an equivalent circuit model of a series of parallel-coupled resistors and capacitors. Knowledge of the detailed impedance of a battery may be useful for fuel-gauging algorithms (e.g., for determining a battery open-circuit voltage and state of charge, predicting power limits, and/or deriving safety limits or safe operation limits of the battery (e.g., a maximum voltage and maximum current of the battery terminal)).

There may exist advantages in using a system load current drawn from a battery in order to perform in-situ characterization of parameters of the equivalent circuit model, as such an approach avoids time-consuming and computationally-expensive offline characterization that measures impedance of a battery across a frequency range. However, spectrally-rich stimulus may be required to accurately estimate equivalent circuit model parameters, and system load current is not guaranteed to contain spectrally-rich content at all times.

SUMMARY

In accordance with the teachings of the present disclosure, one or more disadvantages and problems associated with existing approaches to modeling a battery with an equivalent circuit model may be reduced or eliminated.

In accordance with embodiments of the present disclosure, a method for estimating equivalent circuit model parameters of a battery may include measuring a battery voltage across terminals of the battery and a battery current drawn from the battery, decomposing the battery voltage and the battery current into a plurality of sub-bands, each sub-band of the plurality of sub-bands based on a time constant that characterizes a temporal behavior of the battery, for each sub-band of the plurality of sub-bands, estimating an equivalent resistance for such sub-band based on a spectral content of the battery voltage and battery current for such sub-band, and estimating an open circuit voltage of the battery based at least on the spectral content of the battery voltage and battery current present in one of the plurality of sub-bands and the equivalent resistances of the plurality of sub-bands.

In accordance with these and other embodiments of the present disclosure, a system for estimating equivalent circuit model parameters of a battery, may include circuitry for measuring a battery voltage across terminals of the battery and a battery current drawn from the battery, decomposing the battery voltage and the battery current into a plurality of sub-bands, each sub-band of the plurality of sub-bands based on a time constant that characterizes a temporal behavior of the battery, for each sub-band of the plurality of sub-bands, estimating an equivalent resistance for such sub-band based on a spectral content of the battery voltage and battery current for such sub-band, and estimating an open circuit voltage of the battery based at least on the spectral content of the battery voltage and battery current present in one of the plurality of sub-bands and the equivalent resistances of the plurality of sub-bands.

In accordance with these and other embodiments of the present disclosure, a method for intelligently generating a stimulus for use in characterization of parameters of a model of a battery may include dynamically analyzing a current drawn from the battery by a load, based on analysis of the current, determining a sink current for augmenting the current drawn by the load, and generating the sink current based on a determined need to update the parameters.

In accordance with these and other embodiments of the present disclosure, a system for intelligently generating a stimulus for use in characterization of parameters of a model of a battery may include circuitry for dynamically analyzing a current drawn from the battery by a load, based on analysis of the current, determining a sink current for augmenting the current drawn by the load, and generating the sink current based on a determined need to update the parameters.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
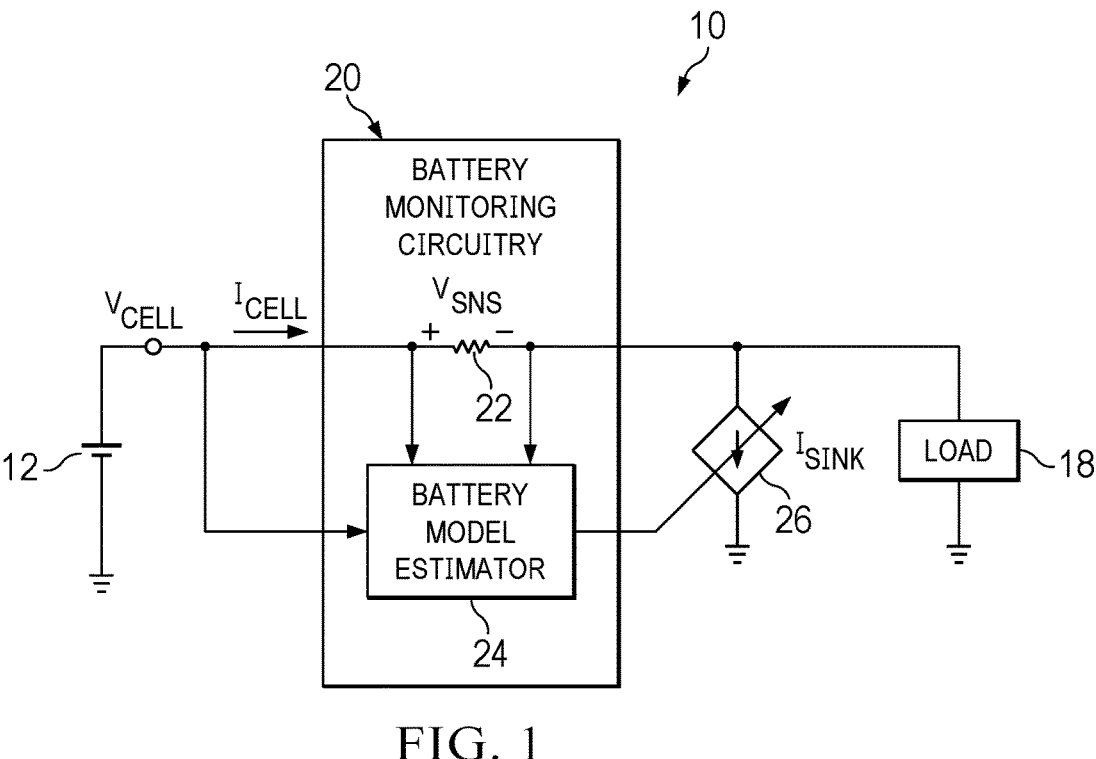
FIG. 1 illustrates a block diagram of selected components of an example power delivery network, in accordance with embodiments of the present disclosure.

FIG. 1 illustrates a block diagram of selected components of an example power delivery network 10, in accordance with embodiments of the present disclosure. In some embodiments, power delivery network 10 may be implemented within a portable electronic device, such as a smart phone, tablet, game controller, and/or other suitable device.

As shown in FIG. 1, power delivery network 10 may include a battery 12 and a load 18. As shown in FIG. 1, when loaded by load 18, battery 12 may generate a battery voltage $V_{CELL}$ across its terminals and deliver a battery current $I_{CELL}$ to load 18. In some embodiments, battery 12 may comprise a lithium-ion battery. Load 18 may represent any electric component, electronic component, and/or combination thereof. For example, load 18 may include any suitable functional circuits or devices of power delivery network 10, including without limitation power converters, processors, audio coder/decoders, amplifiers, display devices, etc. Further, although not explicitly shown in FIG. 1, power delivery network 10 may also include control circuitry for controlling operation of battery 12 and/or load 18.

As also shown in FIG. 1, power delivery network 10 may include battery monitoring circuitry 20. Battery monitoring circuitry 20 may include any suitable system, device, or apparatus configured to monitor battery voltage $V_{CELL}$ and battery current $I_{CELL}$. Further, battery monitoring circuitry 20 may include a battery model estimator 24 configured to receive monitor battery voltage $V_{CELL}$ and a sense voltage $V_{SNS}$ across a sense resistor 22 indicative of battery current $I_{CELL}$, and based thereon, estimate a battery impedance model for battery 12, as described in greater detail below. Battery model estimator 24 may be implemented with a processing device, including without limitation a microprocessor, digital signal processor, application-specific integrated circuit, field-programmable gate array, electrically-erasable programmable read only memory, complex programmable logic device, and/or other suitable processing device. In some embodiments, battery monitoring circuitry 20 may monitor a temperature associated with battery 12, and battery model estimator 24 may estimate the impedance model based on battery voltage $V_{CELL}$, a sense voltage $V_{SNS}$, and the sensed temperature.

As further shown in FIG. 1, power delivery network 10 may further include a dependent current source 26 controlled by battery model estimator 24 and configured to generate a sink current $I_{SINK}$. Control of sink current $I_{SINK}$ by battery model estimator 24 is described in greater detail below.

Figure 2:
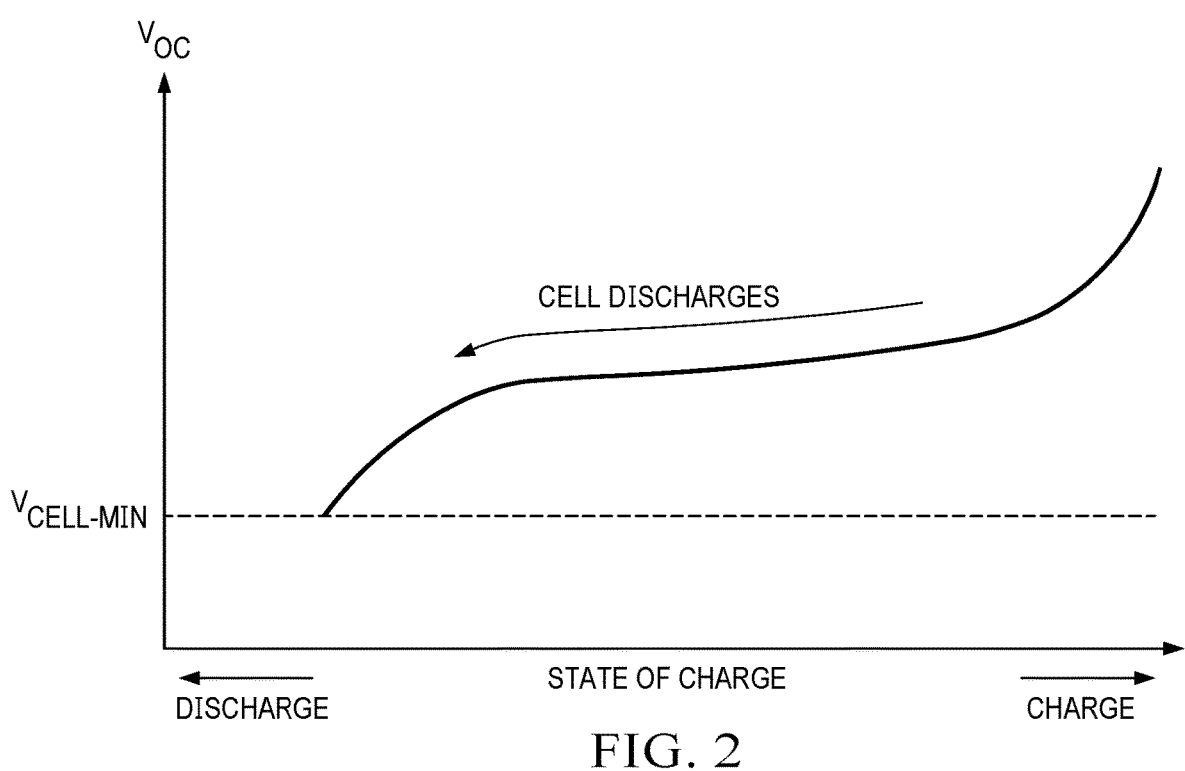
FIG. 2 illustrates an example graph of an open circuit voltage of a battery versus the battery's state of charge, in accordance with embodiments of the present disclosure.

Lithium-ion batteries are typically known to operate from 4.5 V down to 3.0 V. known as an open circuit voltage $V_{OC}$ of the battery (e.g., battery 12). As a battery discharges due to a current drawn from the battery, the state of charge of the battery may also decrease, and open circuit voltage $V_{OC}$ (which may be a function of state of charge) may also decrease as a result of electrochemical reactions taking place within the battery, as shown in FIG. 2. Outside the range of 3.0 V and 4.5 V for open circuit voltage Voc. the capacity, life, and safety of a lithium-ion battery may degrade. For example, at approximately 3.0 V, approximately 95% of the energy in a lithium-ion cell may be spent (i.e., state of charge is 5%), and open circuit voltage $V_{OC}$ would be liable to drop rapidly if further discharge were to continue. Below approximately 2.4 V, metal plates of a lithium-ion battery may erode, which may cause higher internal impedance for the battery, lower capacity, and potential short circuit. Thus, to protect a battery (e.g., battery 12) from over-discharging, many portable electronic devices may prevent operation below a predetermined end-of-discharge voltage. Knowledge of the output impedance may be useful in determining open circuit voltage $V_{OC}$ and other parameters of battery 12.

Figure 3:
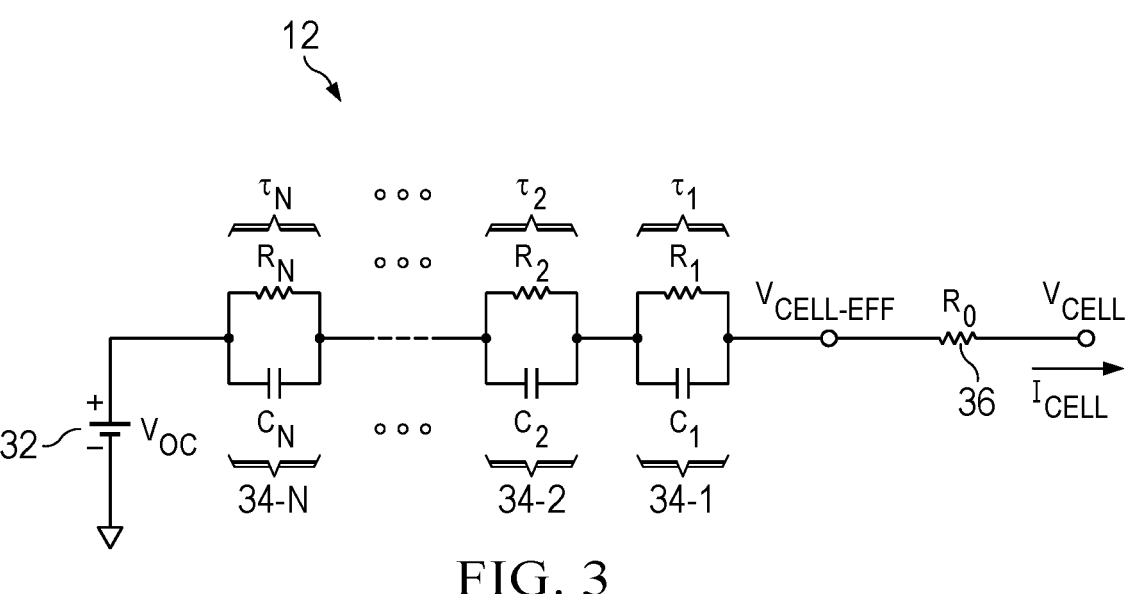
FIG. 3 illustrates a circuit diagram of selected components of an equivalent circuit model for a battery, in accordance with embodiments of the present disclosure.

FIG. 3 illustrates a block diagram of selected components of an equivalent circuit model for battery 12, in accordance with embodiments of the present disclosure. As shown in FIG. 3, battery 12 may be modeled as having a battery cell 32 having an open circuit voltage $V_{OC}$ in series with a plurality of parallel resistive-capacitive sections 34 (e.g., parallel resistive-capacitive sections 34-1, 34-2, . . . , 34-N) and further in series with an equivalent series resistance 36 of battery 12, such equivalent series resistance 36 having a resistance of $R_0$. Resistances $R_1, R_2, \ldots R_N$, and respective capacitances $C_1, C_2, \ldots, C_N$ may model battery chemistry-dependent time constants $\tau_1, \tau_2, \ldots, \tau_N$, that may be lumped with open circuit voltage $V_{OC}$ and equivalent series resistance 36. The series of impedance sections represented by resistive-capacitive sections 34 and equivalent series resistance 36 may represent diffusion processes that occur at different rates inside battery 12. Cutoff frequencies of parallel resistive-capacitive sections 34 may respectively be given by:

$$f_{c1} = \frac{1}{\tau_1} = \frac{1}{2\pi R_1 C_1};$$

$$f_{c2} = \frac{1}{\tau_2} = \frac{1}{2\pi R_2 C_2};$$

$$\ldots$$

$$f_{cN} = \frac{1}{\tau_3} = \frac{1}{2\pi R_N C_N};$$

wherein $\pi$ represents the well-known mathematical constant defined as the ratio of a circle's circumference to its diameter, and wherein parallel resistive-capacitive sections 34 are ordered such that $f_{cN} < \ldots < f_{c2} < f_{c1}$.

Notably, an electrical node depicted with voltage $V_{CELL-EFF}$ in FIG. 3 may capture the time varying discharge behavior of battery 12, and battery voltage $V_{CELL}$ may be an actual voltage seen across the output terminals of battery 12. Voltage $V_{CELL-EFF}$ may not be directly measurable, and thus battery voltage $V_{CELL}$ may be the only voltage associated with battery 12 that may be measured to evaluate battery state of health. Also of note, at a current draw of zero (e.g., $I_{CELL}=0$), battery voltage $V_{CELL}$ may be equal to voltage $V_{CELL-EFF}$ which may in turn be equal to an open circuit voltage $V_{OC}$ at a given state of charge, provided that enough time has passed with the current at zero, such that all of the voltages on capacitors 34 have discharged to zero.

Battery behavior may change due to various factors, including temperature, state of charge, charge/discharge current amplitude and/or frequency, and others. Changes in such factors may change electro-chemical states of the battery, and these dynamic behaviors may result in corresponding changes in parameter values of the equivalent circuit model. Parameters of the equivalent circuit model may be used to assess battery condition, predict future voltage, and/or perform other battery management tasks.

Figure 4:
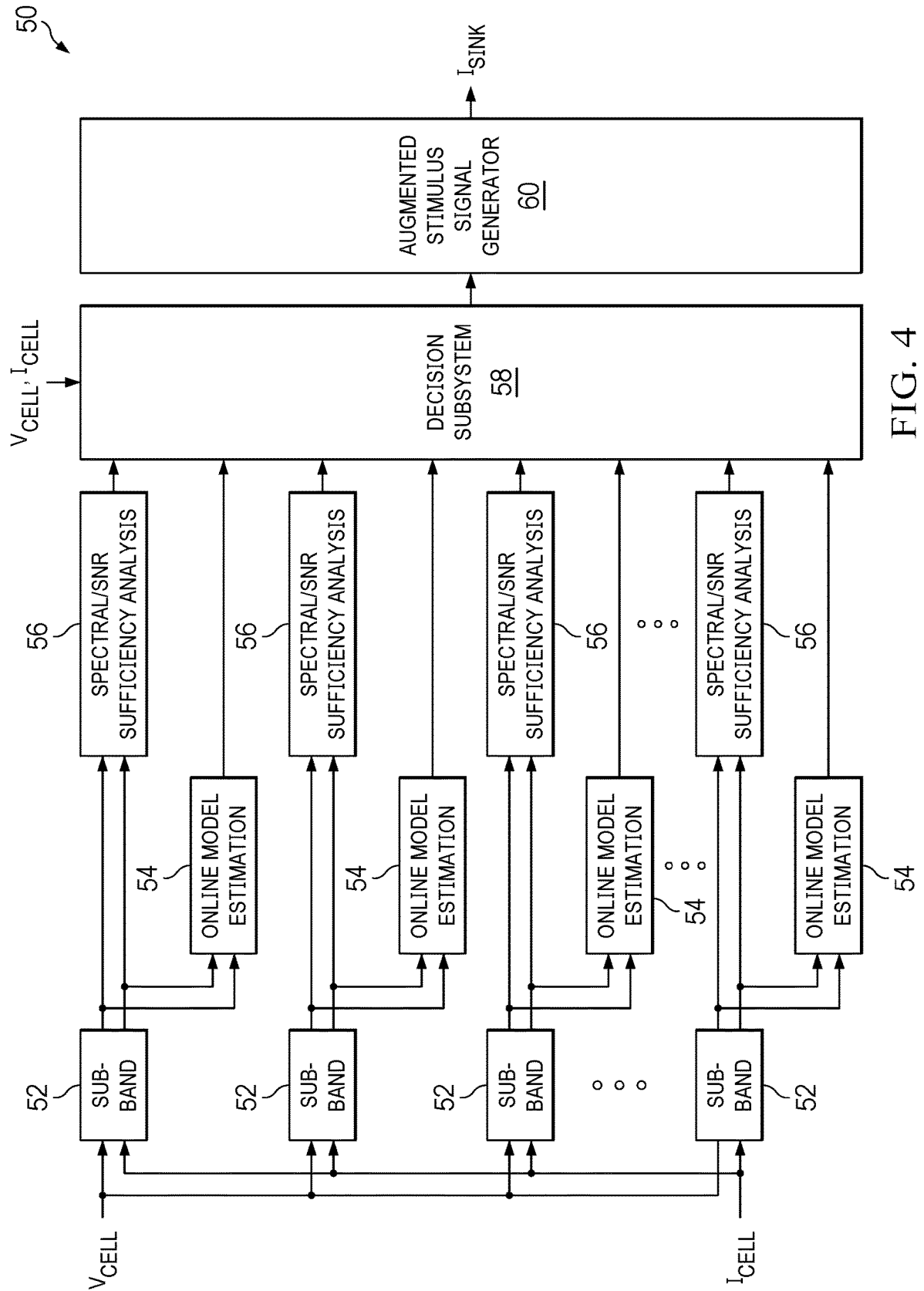
FIG. 4 illustrates a block diagram of a system for online characterization of an equivalent circuit model of a battery using sub-bands and augmented dynamic current stimulus, in accordance with embodiments of the present disclosure.

FIG. 4 illustrates a block diagram of a system 50 for online characterization of an equivalent circuit model of battery 12 using sub-bands and augmented dynamic current stimulus, in accordance with embodiments of the present disclosure. System 50 may be implemented as or as a part of battery model estimator 24.

To estimate an impedance model of battery 12, battery model estimator 24 may divide the output impedance of battery 12 into a number of stages or frequency sub-bands 52, each stage/sub-band 52 corresponding to a respective parallel resistive-capacitive section 34 of the equivalent circuit model, thus breaking down the online model estimation 54 into several identification problems of lower order. Such estimation in stages may be possible due to the fact that cutoff frequencies $f_c$ (or time constants $\tau$) of the diffusion processes represented by the various parallel resistive-capacitive sections 34 may be separated by an order of magnitude or more. Further, battery model estimator 24 may, for each particular frequency sub-band 52, monitor, with spectral/signal-to-noise ratio (SNR) sufficiency analyses 56, the quality of prevailing current stimulus $I_{CELL}$ drawn from battery 12 over time and monitor variance of the various equivalent circuit model parameters for such sub-band. Battery model estimator 24 may further implement a decision subsystem 58 that may analyze online model estimations 54 for each sub-band 52, and results of the spectral/SNR analyses 56 for each sub-band 52, to decide whether to generate augmented current stimulus for a particular sub-band 52. If decision subsystem 58 determines to generate augmented current stimulus for a particular sub-band 52, augmented stimulus signal generator 60 may generate a sink current $I_{SINK}$ to supplement current drawn by load 18 in order to draw battery current $I_{CELL}$ with sufficient spectral content to characterize parameters of the equivalent circuit model of battery 12. Sink current $I_{SINK}$ may be based on a dynamic analysis of battery current $I_{CELL}$ and may also be based on an SNR and/or spectral requirement for the equivalent circuit model estimation algorithm performed by battery model estimator 24, in addition to other system-related requirements.

Figure 5A:
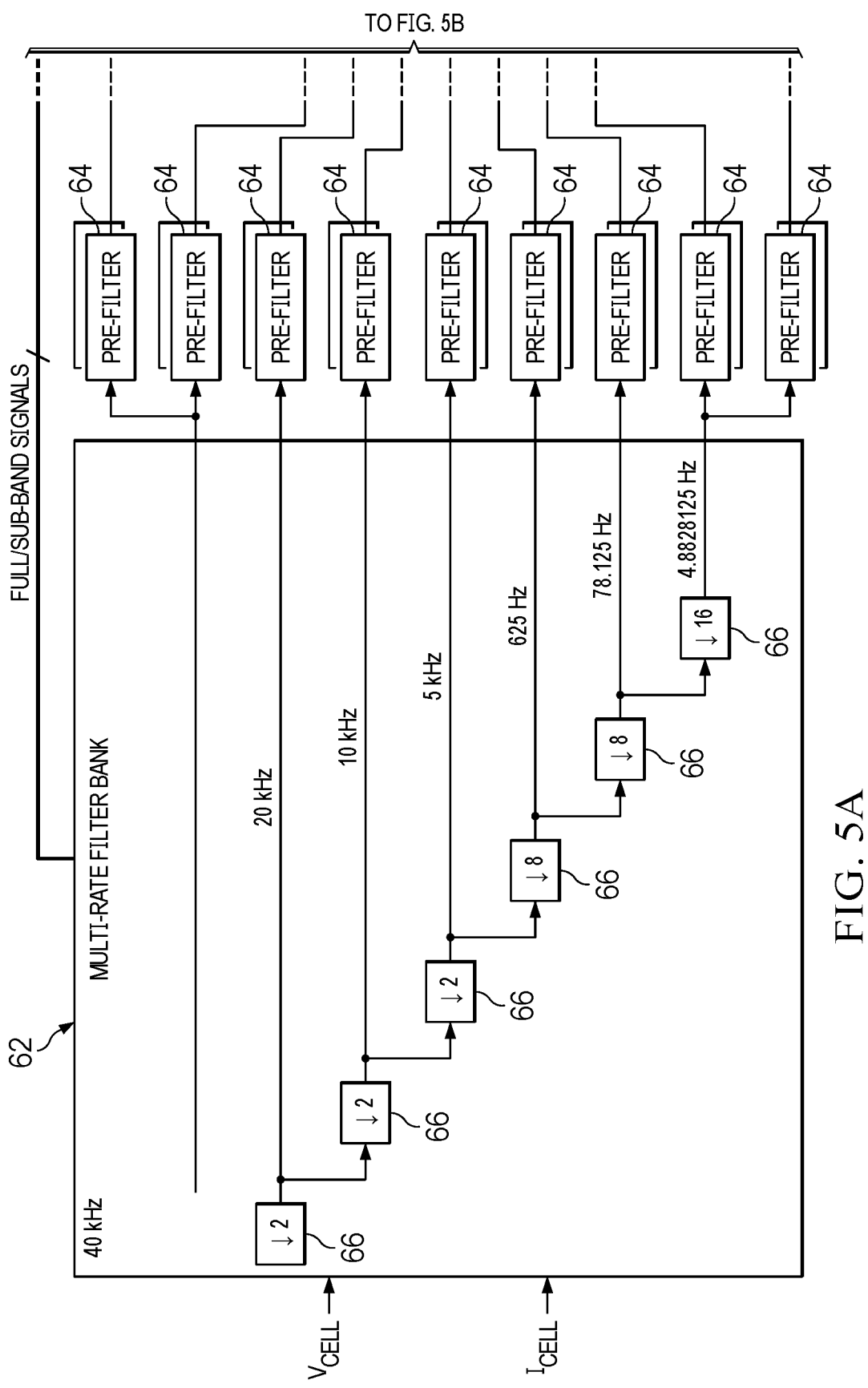
FIGS. 5A and 5B illustrate a block diagram of an example architecture of an algorithm for calculating parameters of an equivalent circuit model of a battery, in accordance with embodiments of the present disclosure.
Figure 5B:
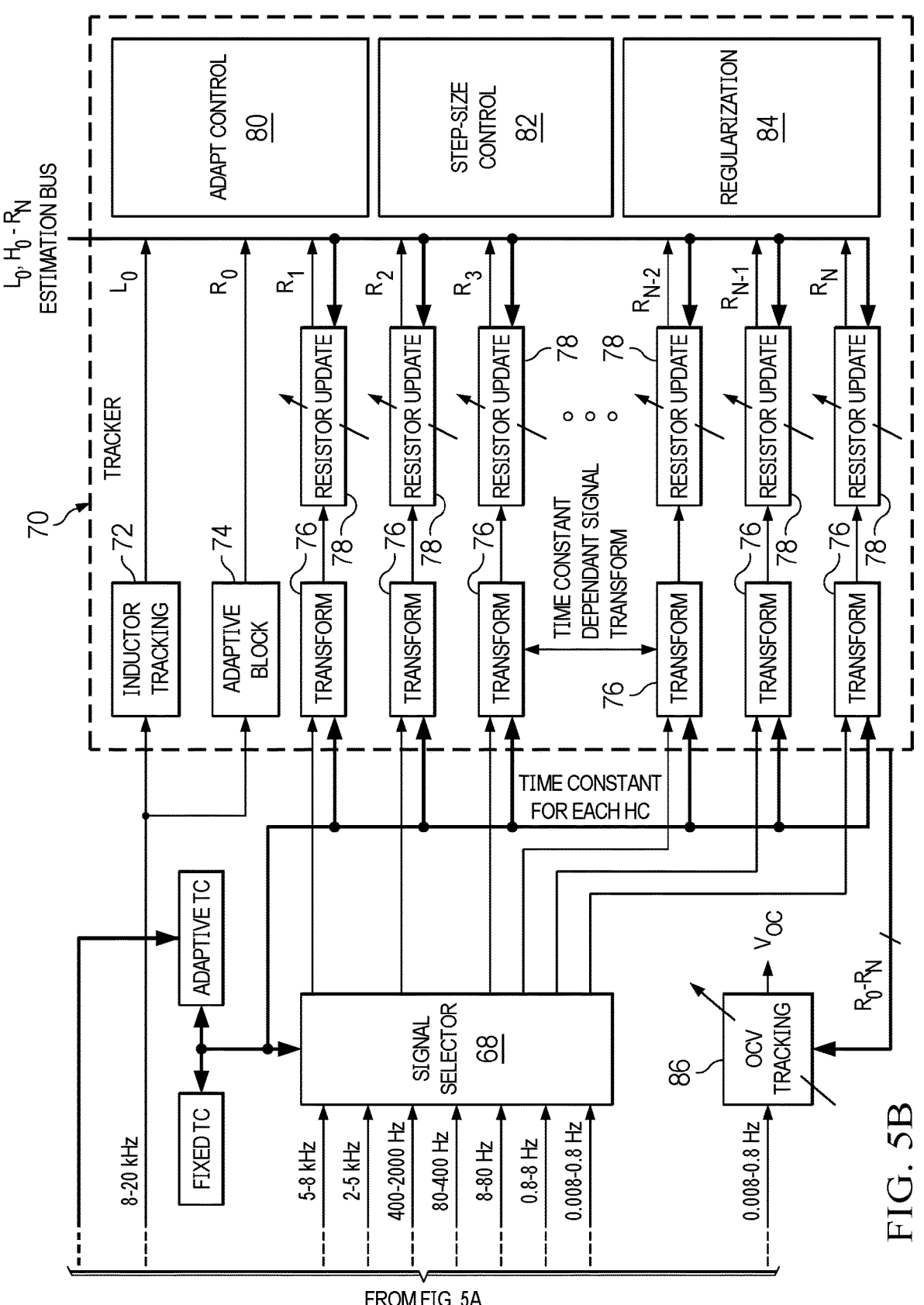

FIGS. 5A and 5B illustrate a block diagram of an example architecture of an algorithm for calculating parameters of an equivalent circuit model of battery 12, in accordance with embodiments of the present disclosure. The functionality of the various blocks depicted in FIGS. 5A and 5B may implement sub-bands 52 and online model estimations 54 shown in FIG. 4.

In accordance with the algorithm depicted in FIGS. 5A and 5B, battery model estimator 24 may measure battery voltage $V_{CELL}$ and battery current $I_{CELL}$. Battery model estimator 24 may further apply different time constants $\tau$ that characterize temporal behaviors of battery 12 to decompose (e.g., with multi-rate filter bank 62) the measured battery voltage $V_{CELL}$ and battery current $I_{CELL}$ into sub-bands 52 based on the different time constants $\tau$. Battery model estimator 24 may also continuously track a resistance R within and associated with each of the sub-bands 52, as well as continuously track open circuit voltage $V_{OC}$ of battery 12. The time constants can either be fixed or estimated dynamically from battery voltage $V_{CELL}$ and battery current $I_{CELL}$.

As shown in FIGS. 5A and 5B, the example architecture comprises a multi-rate filter bank 62 comprising a plurality of decimators 66, pre-filters 64, a signal selector 68, and a tracker 70 arranged as shown.

Multi-rate filter bank 62 is shown in FIG. 5A as having a full band of 40 KHz, but may have any suitable full band range. Further, decimators 66 may each have a decimation rate as shown in FIG. 5A, but may each have a different decimation rate other than that shown in FIG. 5A. Each decimator 66 may respectively decimate battery voltage $V_{CELL}$ and battery current $I_{CELL}$ signals into low-frequency signals. While specific exemplary frequencies are shown associated with decimators 66, any suitable frequencies may be used. The output of each decimator 66 may be communicated to a respective pre-filter 64, and the output of each pre-filter 64 may represent various sub-bands 52 into which the full band of battery voltage $V_{CELL}$ and battery current $I_{CELL}$ signals is divided. For example, FIG. 5B shows the full band divided into sub-bands of 8-20 KHz, 5-8 KHz, 2-5 KHz, 400-2500 Hz, 800-400 Hz, 8-80 Hz, 0.8-8 Hz, 0.008-0.8 Hz, and 0-0.008 Hz, although any suitable ranges may be used for the various sub-bands 52.

A fixed time constant or an adaptive time constant for each parallel resistive-capacitive section 34 may be received by signal selector 68. A fixed time constant may be based on a set of pre-stored values. An adaptive time constant may be computed dynamically through an adaptive algorithm that uses battery voltage $V_{CELL}$ and battery current $I_{CELL}$ and/or the adaptive time constant may be selected from a look-up table whose indices are selected based on the battery state of charge and/or temperature.

As depicted in FIG. 5B, tracker 70 may perform inductor tracking 72 based on the output of pre-filter 64 representing the highest-frequency sub-band 52 in order to estimate an inductive value $L_0$ (not shown in FIG. 5) that models an equivalent resistance in series with equivalent series resistance 36 of battery 12 and an equivalent circuit model of battery 12. Tracker 70 may also include an adaptive block 74 (e.g., a recursive-least squares, total-least squares, normalized least-mean-squares, total least squares cost function, and/or different variants of gradient descent based algorithms) that outputs resistive value $R_0$ for the equivalent circuit model of battery 12 based on the output of pre-filter 64 representing the highest-frequency sub-band 52.

The outputs of the remaining pre-filters 64 may be provided as inputs to signal selector 68. As shown in FIGS. 5A and 5B, a plurality of different time constants, which may be distributed such that they cover an entire spectral range of interest and overall time constant value, may be received by signal selector 68. Signal selector 68 may select, for each transform 76/resistor update 78 pair of tracker 70, a signal from an output of pre-filter 64 based on the time constants. In particular, signal selector 68 may select an appropriate signal from multi-rate filter bank 62 such that spectral coverage of the selected signal includes the frequency corresponding to the respective time constant.

Tracker 70 may further include a plurality of transform 76/resistor update 78 pairs that may calculate respective resistive values $R_1, \ldots, R_N$ of the equivalent circuit model of battery 12. For example, in some embodiments, battery model estimator 24 may calculate respective resistive values $R_1, \ldots, R_N$ of the equivalent circuit model of battery 12 in a manner similar to that disclosed in U.S. patent application Ser. No. 17/463,980, filed Sep. 1, 2021, and incorporated by reference herein. For example, resistor update blocks 78 may continuously update resistances representing each sub-band 52 using an adaptive algorithm, implemented by adapt control block 80 of tracker 70, using a recursive-least squares, a total-least squares, a normalized least-mean-squares, or other suitable approach. In some embodiments, parameters of the equivalent circuit model of battery 12 may be updated by a resistor update block 78: (a) when a full-band current root-mean-square level is above a threshold, (b) such that a sub-band error is minimized; or (c) jointly such that a full band error is minimized. A learning rate of the update algorithm may be based on a sub-band root-mean-square current level. In some embodiments, resistor update blocks 78 may be constrained to calculate only positive resistance values.

Tracker 70 may also include a step-size control block 82. If the adaptive algorithm implemented by adapt control block 80 includes a family of gradient descent based algorithms, then step-size control block 82 may dynamically calculate the learning rate or step size of such algorithm to ensure faster convergence of the parameters while not drifting away from the true value.

Tracker 70 may also include a regularization block 84. Due to the dynamic nature of the signal and also the varying signal-to-noise ratio conditions, it is important that the adaptive algorithm does not diverge too much from the true solution. Regularization block 84 may avoid the problem of overfitting, which may occur when the adaptive algorithm adapts during low signal-to-noise ratio conditions and tries to minimize the modelling error even though the background noise dominates the signal.

The algorithm may also include an open-circuit voltage (OCV) tracking block 86 configured to adaptively estimate open-circuit voltage $V_{OC}$ based on an input received from pre-filter 64 representing the lowest-frequency sub-band 52 and the various resistive values $R_1, \ldots, R_N$ of the equivalent circuit model of battery 12. For example, OCV tracking block 86 may, based on the output of the lowest-frequency pre-filter 64 and tracked resistances of the equivalent circuit model for battery 12, continuously update an estimated open-circuit voltage $V_{OC}$ using an adaptive algorithm (e.g., a recursive-least squares, total-least squares, normalized least-mean-squares). In some embodiments, the OCV may be provided by another estimator or algorithm, such as from a fuel gauge solution.

Figure 6:
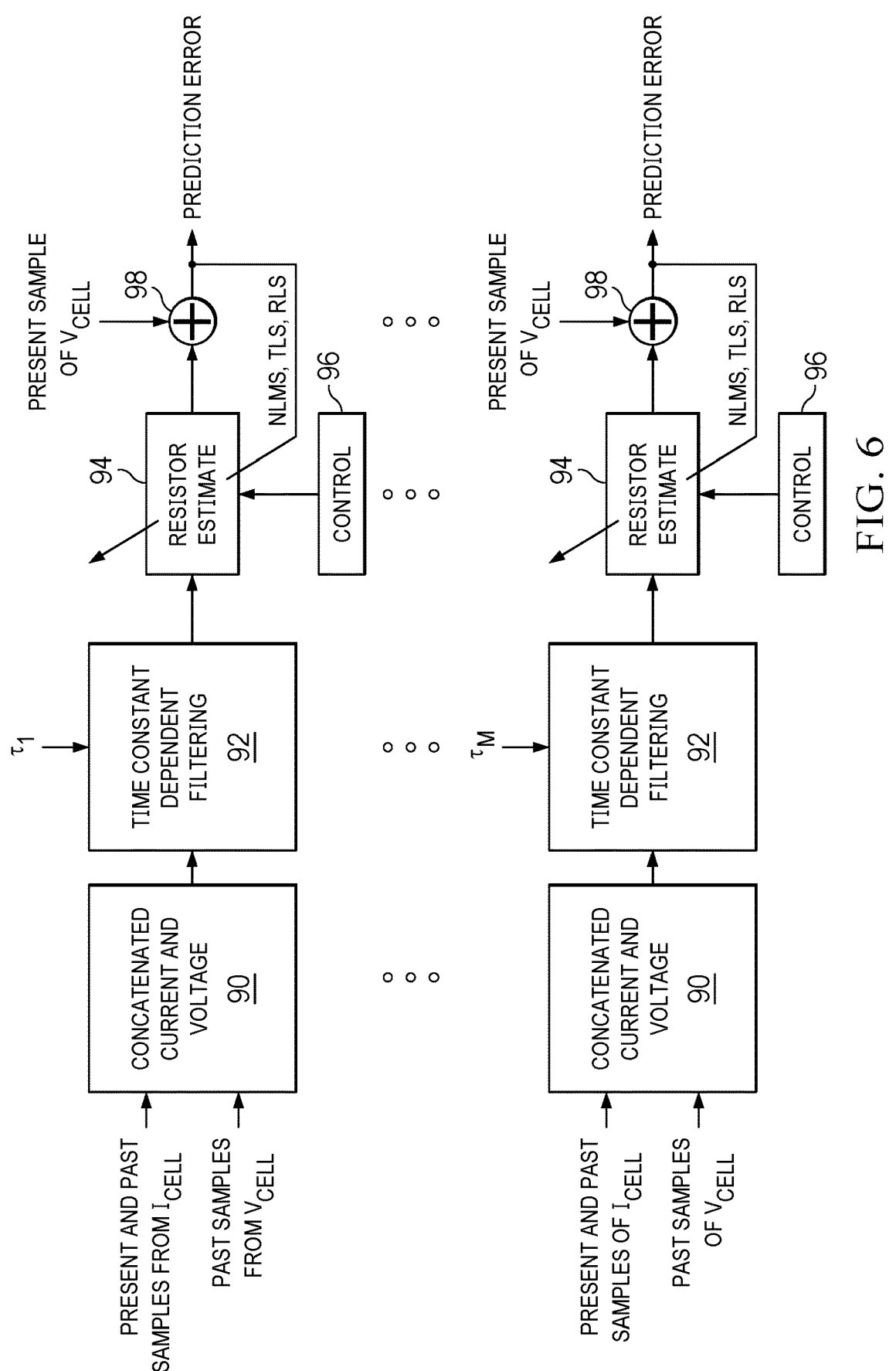
FIG. 6 illustrates a block diagram of an example architecture of a tracker for calculating parameters of an equivalent circuit model of a battery, in accordance with embodiments of the present disclosure.

FIG. 6 illustrates a block diagram of an example architecture of tracker 70 for calculating parameters of the equivalent circuit model of battery 12, in accordance with embodiments of the present disclosure. The architecture shown in FIG. 6 may implement transform blocks 76 and resistor update blocks 78 shown in FIGS. 5A and 5B.

FIG. 6 depicts 1 to M number of paths that process battery voltage $V_{CELL}$ and battery current $I_{CELL}$ signals decomposed into sub-bands 52 as described above. Each processing path may include a concatenated current & voltage block 90, time constant dependent filtering block 92, a resistor estimate block 94, a control block 96, and a summer 98 arranged as shown in FIG. 6. Each concatenated current & voltage block 90 may receive as its input the present and past sample values of battery current $I_{CELL}$ and the past sample values of battery voltage $V_{CELL}$ for the given sub-band 52. Time-constant dependent filtering block 92 may receive the output from its respective concatenated current & voltage block 90 and a time constant $T_i$ for the given sub-band 52. Such filtering may be performed in order to convert the non-linear optimization problem into a linear optimization problem. The original equivalent circuit model identification problem involves estimating either resistor and capacitor or resistor and time constant. Estimating them jointly is a non-linear optimization problem, and it is not suited to be done in embedded applications. Therefore, such filtering may simplify the problem into a linear problem by assuming a priori knowledge of the time constants. The time constants can be determined by offline characterization of a battery, or they can be dynamically estimated by a separate time constant estimation block.

Control block 96 may be configured to provide an indication to the adaptive algorithm that the signal conditions are sufficient enough to update the resistive values (e.g., $R_1, \ldots, R_N$) of its associated resistor estimate block 94. Each resistor estimate block 94 may provide an estimated present sample of battery voltage $V_{CELL}$. for its respective sub-band 52. Combiner 98 may compare the true sample to the predicted present sample to generate a prediction error. Such prediction error may then be used in the parameter update equation of the adaptive filter. Controller 96 may control an update algorithm to control resistor estimate block 94 to minimize the prediction error.

Figure 7:
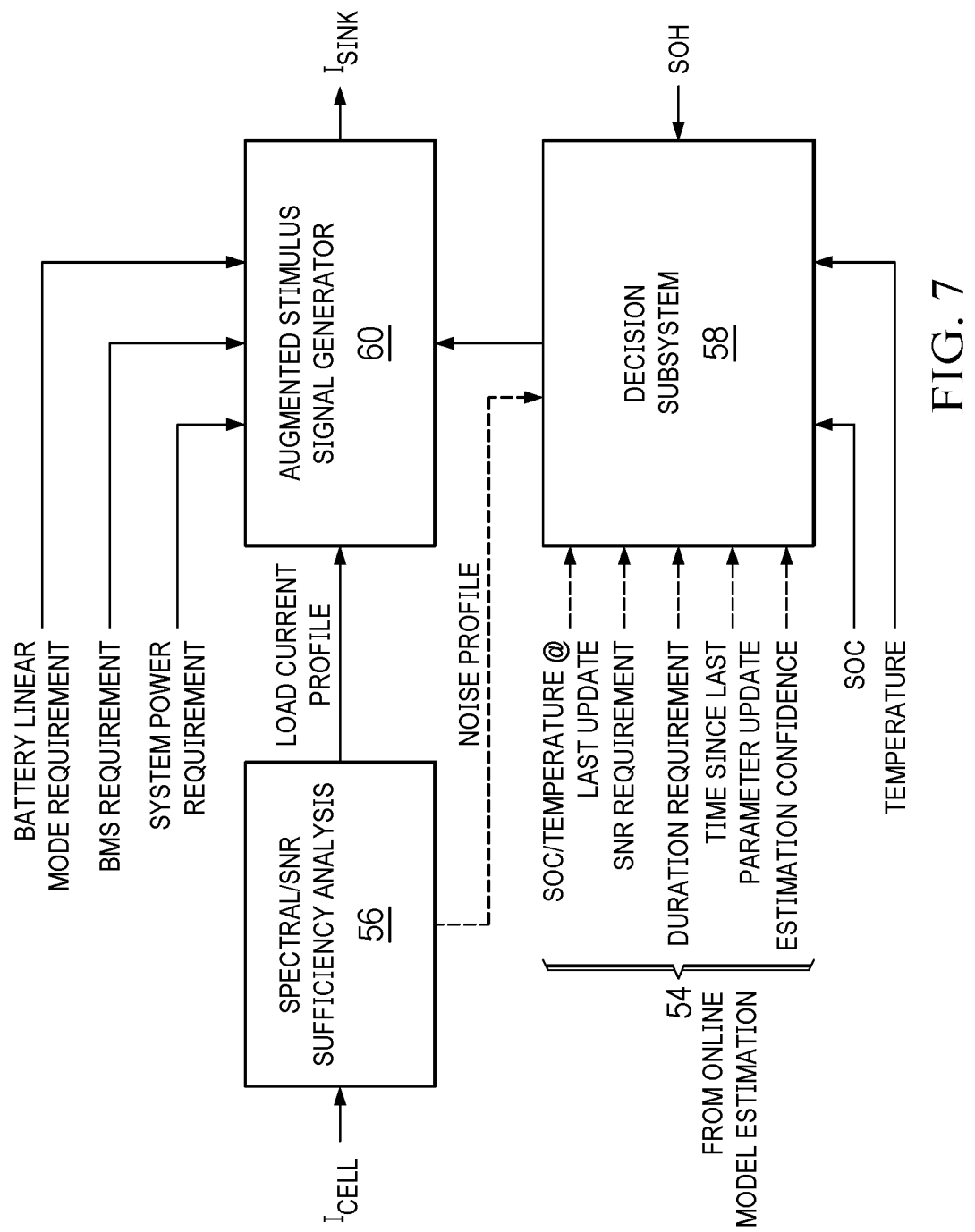
FIG. 7 illustrates a block diagram of selected components of a system for online characterization of an equivalent circuit model of a battery using sub-bands and augmented dynamic current stimulus, in accordance with embodiments of the present disclosure.

FIG. 7 illustrates a block diagram of selected components of system 50, in accordance with embodiments of the present disclosure. In particular, FIG. 7 depicts more detail demonstrating operability among spectral/SNR sufficiency analysis block 56, decision subsystem 58, and augmented stimulus signal generator 60.

When a system load current is present (e.g., when load 18 draws a current from battery 12), the generation of augmented stimulus in the form of sink current $I_{SINK}$ may be performed on a sub-band basis. Decision subsystem 58 may determine an aggregate stimulus requirement within each sub-band based on state-of-charge (SOC) and temperature conditions during the last update of model parameters for the respective sub-band compared with prevailing SOC and temperature conditions (i.e., to determine if any changes to SOC and/or temperature have occurred requiring parameter updates). In addition, decision subsystem 58 may also receive a noise profile from spectral/SNR sufficiency analysis block 56, which may continuously evaluate current within each sub-band for spectral sufficiency and noise. Thus, decision subsystem 58 may also determine the aggregate stimulus requirement within each sub-band based on such noise profile, an SNR requirement for the sub-band, a duration of signal required in the sub-band in order to calculate parameters associated with such sub-band (which may vary among sub-bands), an amount of time that has passed since a previous parameter update for the sub-band, and an estimation confidence for the sub-band. For example, spectral/SNR sufficiency analysis block 56 may analyze battery current $I_{CELL}$ to estimate the prevailing SNR in each sub-band, and decision subsystem 58 may use such SNR information to modify a level of stimulus for such sub-band accordingly. Decision subsystem 58 may also determine the aggregate stimulus requirement within each sub-band based on a state of health (SOH) of battery 12. Decision subsystem 58 may also employ one or more power saving schemes in the decision-making process of determining aggregate stimulus requirement. For example, model parameters in some frequency ranges may not change to SOC and/or temperature changes, and thus, decision subsystem 58 may limit augmented current generation for such sub-bands to conditional triggers other than SOC and/or temperature changes.

Based on the aggregate stimulus requirement determined by decision subsystem 58, a system power requirement, a battery management system requirement, a battery linear mode requirement, and/or other factors, augmented stimulus signal generator 60 may generate sink current $I_{SINK}$ for each particular sub-band. Generally speaking, augmented stimulus signal generator 60 (in concert with decision subsystem 58) may track absolute current, and if current is above a particular threshold, may cause adaptation of equivalent circuit model parameters to be disabled. However, if an absolute current requirement is not met over time, augmented stimulus signal generator 60 may cause generation of a low-level sink current $I_{SINK}$ to be generated such that equivalent circuit model parameters are estimated in a linear range of the operating condition of battery 12.

As briefly mentioned above, generation of sink current $I_{SINK}$ may be conditioned on various factors and conditions. For example, in some embodiments, existence of one or more of the following conditions within a sub-band may be required in order to trigger generation of augmented sink current $I_{SINK}$ for such sub-band:

A significant change in SOC and the absence of sufficient load current in one of the sub-bands or the full band for a preset period of time;

A significant change in temperature without significant load current in a sub-band or the full band since the last validated update of equivalent circuit model parameters;

Fitting performance of a continuously tracked model has drifted without significant load current in a sub-band or the full band for a preset period of time;

Significant change in root-mean-square value of current over a preset period of time;

A rate of change of averaged battery voltage $V_{CELL}$ significantly changing over a preset period of time; and Root-mean-square value of current falls below a threshold for a period of time.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for estimating equivalent circuit model parameters of a battery, comprising:

measuring a battery voltage across terminals of the battery and a battery current drawn from the battery;

decimating, via a multi-rate filter bank comprising a plurality of decimators, the battery voltage and battery current into a plurality of low-frequency signals, wherein the plurality of decimators are communicatively coupled to a plurality of filters configured to receive the plurality of low-frequency signals and generate a plurality of sub-bands, each sub-band of the plurality of sub-bands based on a time constant that characterizes a temporal behavior of the battery;

selecting, via a signal selector communicatively coupled to outputs of the plurality of filters and to inputs of a plurality of transform-resistor pairs, from the plurality of sub-bands, a sub-band for each transform-resistor pair based on an associated time constant;

estimating, via the transform-resistor pairs, an equivalent resistance for each sub-band of the plurality of sub-bands based on a spectral content of the battery voltage and battery current for such sub-band; and estimating, via an open circuit voltage tracking module, an open circuit voltage of the battery based at least on the spectral content of the battery voltage and battery current present in one of the plurality of sub-bands and the equivalent resistances of the plurality of sub-bands.

2. The method of claim 1, wherein the time constants are fixed.

3. The method of claim 1, wherein the time constants are adaptive.

4. The method of claim 1, wherein estimating the equivalent resistance for each sub-band comprises adapting such equivalent resistance using an adaptive algorithm comprises one of an adaptive recursive-least squares, total-least squares, normalized least-mean-squares, total least squares cost function, or gradient descent-based algorithm.

5. The method of claim 4, further comprising updating the equivalent resistance for each sub-band only when a root-mean-square level of the battery current is above a threshold.

6. The method of claim 4, further comprising updating the equivalent resistance for each sub-band to minimize an error for such sub-band.

7. The method of claim 4, further comprising updating the equivalent resistance for each sub-band to minimize a full-band error.

8. The method of claim 4, wherein a learning rate of the adaptive algorithm is based on a root-mean-square level of current within the sub-band.

9. The method of claim 8, wherein the adaptive algorithm comprises an update step that updates the equivalent resistance based on an error.

10. The method of claim 4, wherein a regularization step is applied during a parameter update step of the adaptive algorithm.

11. The method of claim 1, further comprising:

determining a spectral sufficiency of the battery current in each of the sub-bands; and generating an augmented current to be drawn from the battery when a spectral insufficiency is determined to exist in one or more sub-bands.

12. The method of claim 1, further comprising estimating an inductance of the equivalent circuit model based at least on the spectral content of the battery voltage and battery current present in one of the plurality of sub-bands.

13. A system for estimating equivalent circuit model parameters of a battery, comprising circuitry for measuring a battery voltage across terminals of the battery and a battery current drawn from the battery, wherein the circuitry comprises:

a multi-rate filter bank comprising a plurality of decimators configured to decimate the battery voltage and battery current into a plurality of low-frequency signals, wherein the plurality of decimators are communicatively coupled to a plurality of filters configured to receive the plurality of low-frequency signals and generate a plurality of sub-bands, each sub-band of the plurality of sub-bands based on a time constant that characterizes a temporal behavior of the battery;

a signal selector communicatively coupled to outputs of the plurality of filters and to inputs of a plurality of transform-resistor pairs, wherein the signal selector is configured to receive the plurality of sub-bands and select, for each transform-resistor pair, a sub-band based on an associated time constant, wherein the plurality of transform-resistor pairs are configured to estimate an equivalent resistance for each sub-band of the plurality of sub-bands based on a spectral content of the battery voltage and battery current for such sub-band; and an open circuit voltage tracking module configured to estimate an open circuit voltage of the battery based at least on the spectral content of the battery voltage and battery current present in one of the plurality of sub-bands and the equivalent resistances of the plurality of sub-bands.

14. The system of claim 13, wherein the time constants are fixed.

15. The system of claim 13, wherein the time constants are adaptive.

16. The system of claim 13, wherein estimating the equivalent resistance for each sub-band comprises adapting such equivalent resistance using an adaptive algorithm comprising one of an adaptive recursive-least squares, total-least squares, normalized least-mean-squares, total least squares cost function, or gradient descent-based algorithm.

17. The system of claim 16, the circuitry further configured for updating the equivalent resistance for each sub-band only when a root-mean-square level of the battery current is above a threshold.

18. The system of claim 17, the circuitry further configured for updating the equivalent resistance for each sub-band to minimize a full-band error.

19. The system of claim 16, the circuitry further configured for updating the equivalent resistance for each sub-band to minimize an error for such sub-band.

20. The system of claim 16, wherein a learning rate of the adaptive algorithm is based on a root-mean-square level of current within the sub-band.

21. The system of claim 20, wherein the adaptive algorithm comprises an update step that updates the equivalent resistance based on an error.

22. The system of claim 16, the circuitry further configured for applying a regularization step during a parameter update step of the adaptive algorithm.

23. The system of claim 13, the circuitry further configured for:

determining a spectral sufficiency of the battery current in each of the sub-bands; and generating an augmented current to be drawn from the battery when a spectral insufficiency is determined to exist in one or more sub-bands.

24. The system of claim 13, the circuitry further configured for estimating an inductance of the equivalent circuit model based at least on the spectral content of the battery voltage and battery current present in one of the plurality of sub-bands.

* * * * *